US009552856B2

(12) United States Patent
Tang et al.

(10) Patent No.: US 9,552,856 B2
(45) Date of Patent: Jan. 24, 2017

(54) MEMORY TIMING SELF-CALIBRATION (71) Applicant: Micron Technology, Inc., Boise, ID (US)

(72) Inventors: Qiang Tang, Cupertino, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/095,347

(22) Filed: Apr. 11, 2016

(65) Prior Publication Data

US 2016/0225420 A1  Aug. 4, 2016

Related U.S. Application Data (62) Division of application No. 14/590,344, filed on Jan. 6, 2015, now Pat. No. 9,312,022.

(51) Int. Cl.
| | |
|---|---|
| *G11C 7/22* | (2006.01) |
| *G11C 11/4076* | (2006.01) |
| *G11C 7/10* | (2006.01) |
| *G11C 16/32* | (2006.01) |
| *G11C 29/02* | (2006.01) |
| G11C 16/10 | (2006.01) |
| G11C 11/4093 | (2006.01) |
| G11C 29/04 | (2006.01) |

(52) U.S. Cl.
CPC ............ *G11C 7/22* (2013.01); *G11C 7/106* (2013.01); *G11C 16/32* (2013.01); *G11C 29/023* (2013.01); *G11C 29/028* (2013.01); G11C 7/1066 (2013.01); G11C 7/1087 (2013.01); G11C 7/222 (2013.01); G11C 11/4076 (2013.01); G11C 11/4093 (2013.01); G11C 16/10 (2013.01); G11C 2029/0409 (2013.01)

(58) Field of Classification Search
CPC ... G11C 7/222; G11C 11/4076; G11C 7/1066; G11C 11/4093; G11C 29/028; G11C 7/1087
USPC ................. 365/194, 189.05, 233.5, 233.1
See application file for complete search history.

(56) References Cited

U.S. PATENT DOCUMENTS

| | | |
|---|---|---|
| 7,010,014 B1 | 3/2006 | Percey et al. |
| 7,564,283 B1 | 7/2009 | Logue et al. |
| 9,312,022 B1 | 4/2016 | Tang et al. |
| 2006/0268632 A1 | 11/2006 | Schnell et al. |
| 2007/0171760 A1 | 7/2007 | Gomm et al. |
| 2008/0080649 A1 | 4/2008 | Gibbons et al. |
| 2008/0129357 A1 | 6/2008 | Chlipala et al. |

(Continued)

*Primary Examiner* — Ly D Pham
(74) *Attorney, Agent, or Firm* — Schwegman Lundberg & Woessner, P.A.

(57) ABSTRACT

Methods for memory input timing self-calibration, apparatuses for input timing self-calibration, and systems are disclosed. One such method includes sequentially programming a plurality of delay trim settings into a delay circuit of a data path. The data path can include a data latch coupled to the delay circuit. A clock is coupled to the data latch to clock data into the data latch. Transitions of the data are substantially aligned with transitions of the clock. An output of the data latch is read after each delay trim setting is programmed. A boundary is determined between a first output state of the data latch and a second output state of the data latch wherein the boundary is associated with a particular delay trim setting of the plurality of delay trim settings. The particular delay trim setting is programmed into the delay circuit.

20 Claims, 6 Drawing Sheets

(56) References Cited

U.S. PATENT DOCUMENTS

2011/0156785 A1 6/2011 Bettini et al.
2012/0327734 A1 12/2012 Sato

MEMORY TIMING SELF-CALIBRATION

PRIORITY APPLICATION

This application is a divisional of U.S. application Ser. No. 14/590,344, filed Jan. 6, 2015, which is incorporated herein by reference in its entirety.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that may allow for high memory densities, high reliability, and low power consumption. Changes in threshold voltage of the cells, through programming of a charge storage structure, such as floating gates, trapping layers or other physical phenomena, may determine the data state of each cell.

Due to increasing data rates for flash memory input/output (I/O), meeting a setup/hold time is becoming more difficult for high speed flash memory. Presently, memory device setup/hold times can be trimmed during a manufacturing/testing operation. Once a nominal delay time is determined during the testing of the memory, this delay time can then be trimmed into all memory devices having those same circuits.

However, since each memory device can have slightly different characteristics due to doping levels or material differences, the nominal delay times may not provide the proper delay for all memory devices. There are resulting needs to provide improved delay time trimming for memory devices.

DETAILED DESCRIPTION

In the following detailed description, reference is made to the accompanying drawings that form a part hereof and in which are shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 1:
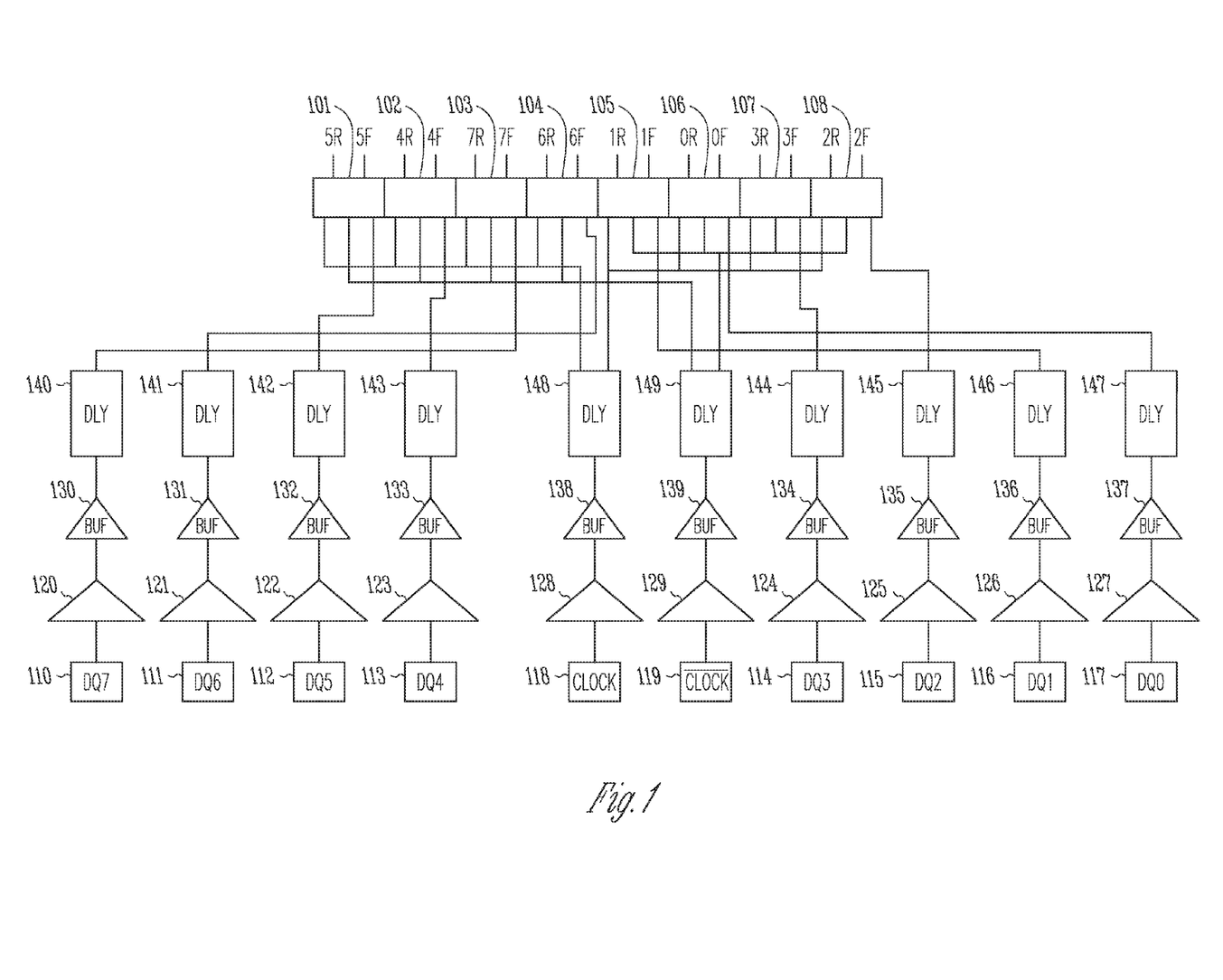
FIG. 1 illustrates a schematic diagram of a typical memory delay trimming circuit.

FIG. 1 illustrates a schematic diagram of a typical memory delay trimming circuit. The circuit includes a plurality of data latches (e.g., D-type flip-flops) 101-108 that can store a logical "1" or a logical "0", as determined by data present on a respective data input (e.g., "D" input) of each flip flop 101-108. The data on the respective data input is clocked into the respective data latch by a clock signal "CK".

Each data latch 101-108 includes two outputs: "nR" and "nF". Each "nR" output is the rising edge of the data being clocked into the respective data latch. Each "nF" output is the falling edge of the data being clocked into the respective data latch. In both cases "n" is the number of the "DQ" pad associated with the respective data latch.

Figure 2:
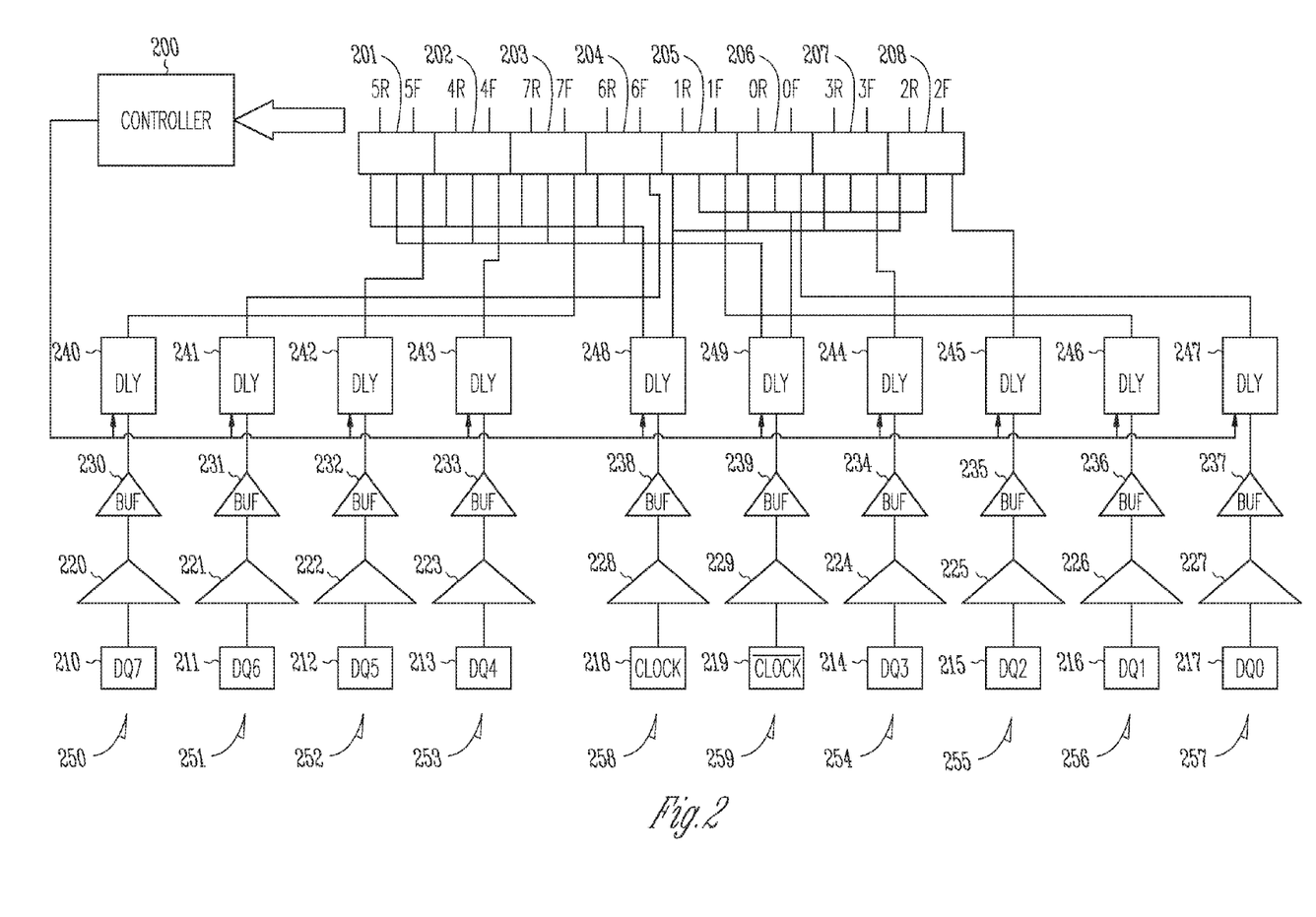
FIG. 2 illustrates a circuit schematic diagram of an embodiment of a memory delay trimming apparatus having input timing self-calibration in accordance with various embodiments.

Use of the term "DQ" can refer to any type of input and/or output of a circuit. For example, a DQ pad can refer to a physical, conductive pad or some other type of input/output. Each DQ pad of FIGS. 1 and 2 is illustrated as an input to each data path. Similarly, a clock pad can refer to any type of clock input/output.

A plurality of "DQn" pads 110-117 are inputs to the data latches 101-108. A clock pad 118 and a $\overline{\text{clock}}$ pad 119 can be coupled to a clock and inverse clock, respectively, to latch the data into the data latches 101-108.

Each of the "DQn" pads 110-117 is coupled to a respective first and second input buffer 120-127 and 130-137. Similarly, each of the clock 118 pad and the $\overline{\text{clock}}$ pad 119 is coupled to a respective input buffer 128, 129 and 138, 139.

The outputs of the buffers 120-129 and 130-139 are coupled to a respective delay circuit 140-149 for the data inputs (e.g., DQn) 110-117 and clock inputs (e.g., clock, $\overline{\text{clock}}$) 118, 119. The outputs of the delay circuits 140-149 are coupled to their respective data latch 101-108.

Each delay circuit 140-149 is configured to provide a variable delay that is programmed into the delay circuit 140-149 during a manufacture and test process and is typically referred to as a trim operation. The typical prior art procedure can include programming each delay circuit 140-148 with a respective delay that has been determined to be "nominal" for that particular data path. The nominal value can be determined as an average delay for that particular path as determined by empirical testing.

However, different memory devices can have slightly different characteristics due to doping levels and/or material differences. Thus, the nominal delay time for one memory device may not provide the proper delay for another memory device.

FIG. 2 illustrates a circuit schematic diagram of an embodiment of a memory delay trimming apparatus having timing self-calibration in accordance with various embodiments. The illustrated embodiment can include a controller (e.g., state machine) 200 that is configured to program different delays into respective delay circuits 240-248 as determined by the input timing self-calibration method illustrated in FIG. 4. The input timing self-calibration apparatus and method can provide zero setup/hold time for each data latch by trimming each individual data path of each memory device, instead of using a "nominal" trim value for all memory devices as used by the prior art.

The circuit of FIG. 2 includes a plurality of data latches (e.g., D-type flip-flops) 201-208 that can store a logical "1" or a logical "0", as determined by data present on a respective data input (e.g., "D" input) of each flip flop 201-208 during a clock transition. The data on the respective data input is clocked into the respective data latch by a clock signal clock presented on the clock input pad 218 and an inverse clock signal $\overline{\text{clock}}$ presented on the inverse clock input pad 219.

Each data latch 201-208 includes two outputs: "nR" and "nF". Each "nR" output is the rising edge of the data being clocked into the respective data latch. Each "nF" output is the falling edge of the data being clocked into the respective data latch. In both cases "n" is the number of the "DQ" pad (e.g., DQ0-DQ7) associated with and coupled to the respective data latch.

The plurality of "DQn" pads 210-217 are inputs to the data latches 201-208. The clock pad 218 and the $\overline{\text{clock}}$ pad 219 can be coupled to a clock and inverse clock, respectively, to latch the data into the data latches 201-208 as illustrated in the timing diagram of FIG. 3.

Each of the "DQn" pads 210-217 is coupled to a respective first and second input buffer 220-227 and 230-237. Similarly, each of the clock 218 pad and the $\overline{\text{clock}}$ pad 219 is coupled to a respective input buffer 228, 229 and 238, 239.

The outputs of the buffers 220-229 and 230-239 are coupled to a respective delay circuit 240-249 for the data inputs (e.g., DQn) 210-217 and clock inputs (e.g., clock, $\overline{\text{clock}}$) 218, 219. The outputs of the delay circuits 240-249 are coupled to their respective data latch 201-208.

A data path 250-257 of FIG. 2 can be defined as all of the circuitry between the input pad DQn and its respective data latch 201-208. For example, a first data path 250 includes input pad DQ7, buffers 220, 230, and delay circuit 240. A second data path 251 includes input pad DQ7, buffers 221, 231, and delay circuit 241. A third data path 252 includes input pad DQ7, buffers 222, 232, and delay circuit 242. A fourth data path 253 includes input pad DQ7, buffers 223, 233, and delay circuit 243. A fifth data path 254 includes input pad DQ7, buffers 224, 234, and delay circuit 244. A sixth data path 255 includes input pad DQ7, buffers 225, 235, and delay circuit 245. A seventh data path 256 includes input pad DQ7, buffers 226, 236, and delay circuit 246. An eighth data path 257 includes input pad DQ7, buffers 227, 237, and delay circuit 247.

Similarly, the clock paths of FIG. 2 can be defined as all of the circuitry between the clock input pad 218, 219 and all of the data latches 201-208. For example, clock path 258 clock includes input clock pad 218, buffers 228, 238, and delay circuit 248. Clock path $\overline{\text{clock}}$ includes input clock pad 219, buffers 229, 239, and delay circuit 249.

The above-described elements for each data and clock path illustrate only one possible embodiment for these paths. Other embodiments can have different elements in each data path and/or clock path.

The controller 200 is coupled to each of the delay circuits 240-249. This enables the controller 200 to individually program each of the delay circuits 240-249 according to the method of FIG. 4.

Figure 4:
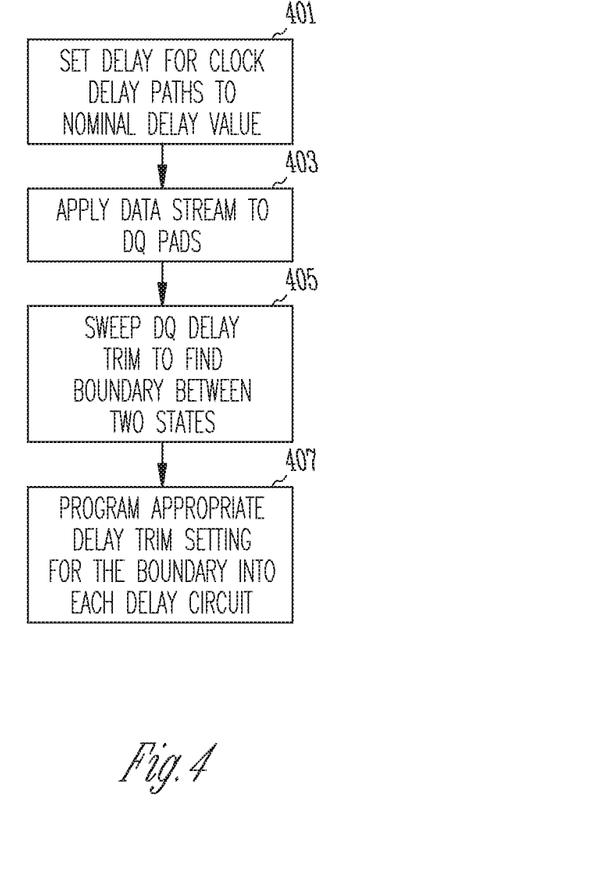
FIG. 4 illustrates a flowchart of an embodiment of a method for input timing self-calibration.
Figure 5:
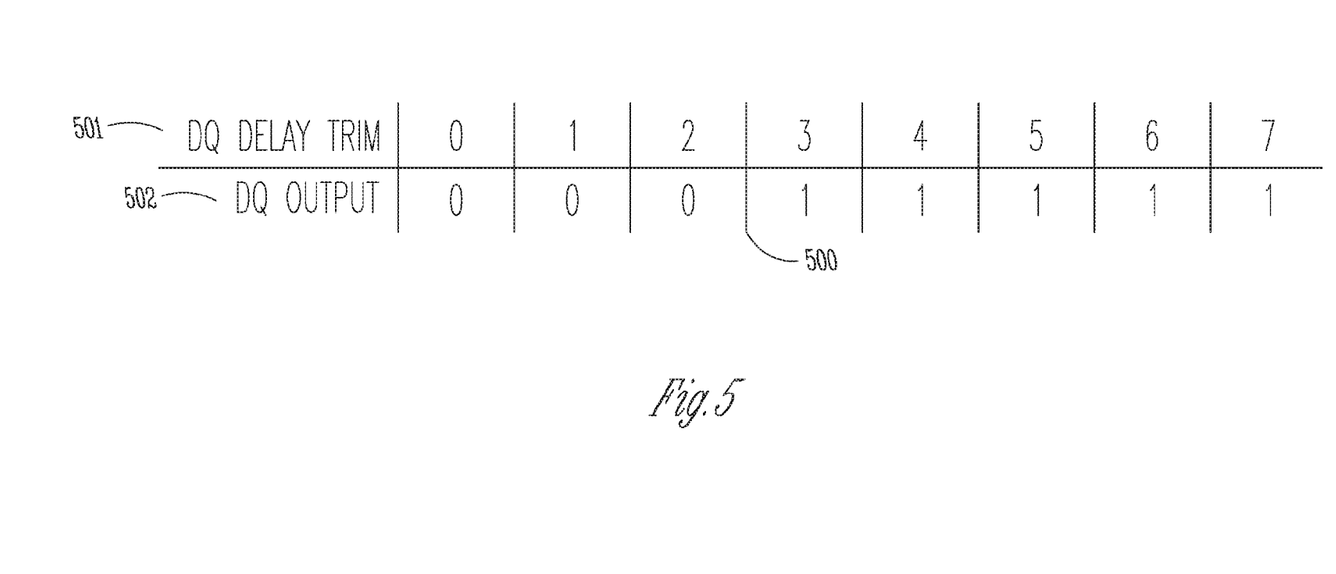
FIG. 5 illustrates a table of an embodiment of delay trim setting and resulting data latch output in accordance with various embodiments.

The controller 200 is also coupled to the outputs of the data latches 201-208 in order to determine when a data latch 201-208 has been programmed with either a logical 0 or a logical 1, as seen in the table of FIG. 5. This enables the controller 200 to determine the boundary between a logical 0 and a logical 1 being programmed in response to a delay trim setting, as discussed subsequently with reference to FIGS. 4 and 5.

Figure 3:
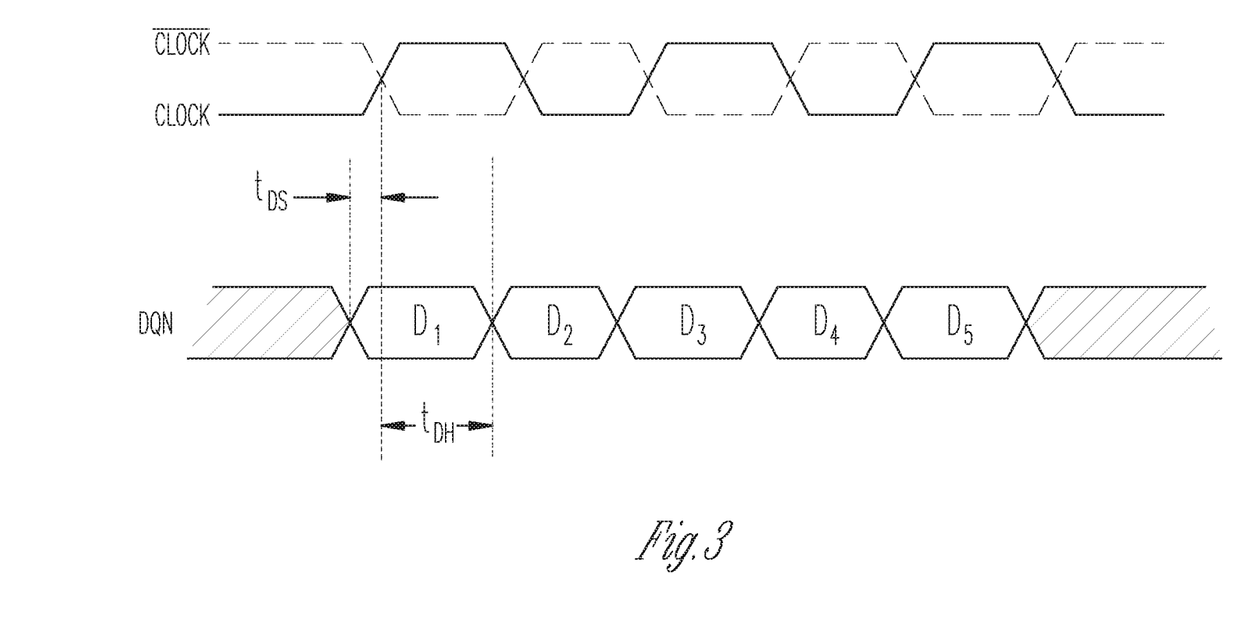
FIG. 3 illustrates a timing diagram of an embodiment of data latch timing in accordance with the embodiment of FIG. 2.

FIG. 3 illustrates a timing diagram of an embodiment of data latch timing in accordance with the embodiment of FIG. 2. Clocks clock and $\overline{\text{clock}}$ are shown on top and data bits D1-D5 for the DQn inputs are shown below the clocks.

It can be seen that the data is going to a true state prior to the clock edges that latch the data into the data latches. This is the set-up time $t_{DS}$ that can be defined as the minimum amount of time, before the clock's active edge, that the data should be stable for it to be latched correctly. The time $t_{DH}$ is the hold time that can be defined as the minimum amount of time after the clock's active edge during which data should be stable.

FIG. 4 illustrates a flowchart of an embodiment of a method for input timing self-calibration. It is the object of the embodiments to get both the set up and hold times as close to zero as possible for each of the data paths. The method is read with reference to the delay trim setting table of FIG. 5.

FIG. 5 illustrates a table of an embodiment of delay trim setting and resulting data latch output in accordance with various embodiments. The upper portion 501 of the table shows the delay trim setting while the lower portion 502 shows a possible data latch output associated with each of those delay trim settings. Each of these table portions 501, 502 are for purposes of illustration only as different embodiments can generate both different quantities of delay trim settings and different associated data latch outputs.

The delay trim settings are illustrated as being 0-7. Such delay trim settings would be the result of a three-bit delay trim (e.g., $b_2 b_1 b_0$). Thus, for example, a delay trim of 000 would be representative of DQ delay trim setting 0, delay trim 001 would be representative of DQ delay trim setting 1, delay trim 010 would be representative of DQ delay trim setting 2, delay trim 011 would be representative of DQ delay trim setting 3, delay trim 100 would be representative of DQ delay trim setting 4, delay trim 101 would be representative of DQ delay trim setting 5, delay trim 110 would be representative of DQ delay trim setting 6, and delay trim 111 would be representative of DQ delay trim setting 7.

Other delay trims having different lengths would result in different quantities of DQ delay trim settings and, thus, greater granularity of delay. For example, a delay trim having more bits would have a greater granularity and, thus, smaller delay step sizes as compared to a delay trim having fewer bits that would have less granularity and larger delay step sizes.

Referring to FIGS. 4 and 5, at block 401, the input timing self-calibration method sets the delay trim settings in the delay circuits 248, 249 for the clock/$\overline{\text{clock}}$ paths 258, 259 to an initial, nominal delay value. The nominal delay value can be determined by experimentation to produce a delay that can substantially align both rising and falling clock edges with the respective rising and falling data edges. The nominal delay value can provide a useful range for the $t_{DS}/t_{DH}$ DQn trim settings.

At block 403, a data stream can be applied to the DQn pads 210-217 with transitions substantially aligned (e.g., within picoseconds) to the clock (e.g., clock) and inverse clock (e.g., $\overline{\text{clock}}$) transitions. In other words, $t_{DS}$ and $t_{DH}$ can be approximately zero.

At block 405, a sweep of the DQ delay trim settings is performed in order to determine a boundary 500 between two output states (e.g., between reading a logical 0 and reading a logical 1) at each data latch output. This sweep can be accomplished by the controller sequentially programming each of the delay trim settings of the table of FIG. 5 into each of the delay circuits 240-249 and reading the data latch output resulting from a respective delay trim setting.

In other words, referring to the circuit of FIG. 2, the controller can program each of the delay trim settings of FIG. 5 into the delay circuit 240 of the first data path 250 and read the data latch 201 after each different delay trim setting is programmed. The controller can then perform this same procedure for each of the other data paths 251-257.

In another embodiment, the controller can program only the first delay trim setting into each delay circuit 240-247 and read the resulting output from the associated data latch 201-208. This can be repeated through each of the delay trim settings until all of the delay trim settings have been programmed and the results read.

The table of FIG. 5 shows the boundary trim setting to be a delay trim setting of either 2 or 3. Either of these delay trim settings can be used in that particular data path depending on a preference toward providing more timing margin for one state over another. For example, in the embodiment of FIG. 5, using the delay trim setting of 2 would provide slightly more timing margin to logical 0 data while using the delay trim setting of 3 would provide slightly more timing margin to logical 1 data. With a fine enough granularity of delay steps, either of these delay trim settings can provide substantially reduced setup and hold times (e.g., $t_{DS}$ and $t_{DH}$ of approximately zero).

The order of the logical states illustrated in FIG. 5 is for purposes of illustration only. The controller can read a logical 1 state for a first particular quantity of DQ delay trim settings and a logical 0 state for a second particular quantity of DQ delay trim settings. Similarly, there is no particular DQ delay trim setting that forms the boundary between the two states.

At block 407, the appropriate delay trim setting for the boundary 500, as determined by the sweep procedure, is programmed into each delay circuit. This can provide each data path with a different delay trim as appropriate for that particular data path's characteristics.

If, in the above method, the boundary 500 cannot be determined, the clock/$\overline{\text{clock}}$ delay trims can be adjusted in order to substantially align the clock path delay to the DQ path delay. The adjustment can be made until a boundary 500 is determined.

Different data patterns can be used in order to determine an input path sensitivity. If those boundary conditions are different, a middle value of all of the boundary conditions can be used to achieve the best overall timing margin.

The above-described embodiments can be performed by a manufacturer during manufacturing and testing of a memory device. The above-described embodiments can also be initiated by a memory user in order to compensate for timing shifts caused by apparatus usage over time and/or user conditions (e.g., voltage differences over time, temperature differences over time).

Figure 6:
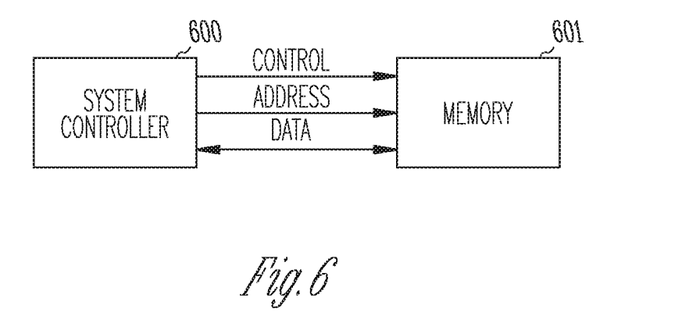
FIG. 6 illustrates a block diagram of an embodiment of a system.

FIG. 6 illustrates an embodiment of a system that can use the memory input timing self-calibration as previously described. A system controller 600 can be used to control operations of the system. A memory device 601, coupled to the controller 600, may include a memory array comprising a plurality of memory cells. In an embodiment, the system controller 600 can be coupled to the memory device 601 over control, data, and address buses. In another embodiment, the address and data buses may share a common input/output (I/O) bus. The memory can be volatile (e.g., RAM, DRAM, SRAM) or non-volatile (e.g., flash, phase change memory, resistive).

An apparatus may be defined as circuitry, an integrated circuit die, a device, or a system.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A method comprising:
    setting delays for clock and inverse clock paths such that clock transitions and inverse clock transitions are substantially aligned with data transitions;
    applying a data stream to inputs of a plurality of data paths, each data path comprising a delay circuit and a data latch clocked by the clock and inverse clock;
    sweeping delay trim settings to find a boundary between two output states at each data latch; and
    programming the delay circuit of each data path with a delay trim setting associated with the boundary for each respective data path.

2. The method of claim 1, further comprising a user of a memory device initiating the method.

3. The method of claim 2, wherein the method is initiated in response to timing shifts caused by memory device usage over time and/or user conditions.

4. The method of claim 1, wherein the delay trim settings are part of a multiple bit delay trim.

5. The method of claim 1, wherein sweeping the delay trim settings to find the boundary between two output states at each data latch comprises:
    programming a first delay trim setting into each delay circuit of each data path;
    reading a resulting output from the data latch of each data path; and
    repeating the programming of the first delay trim setting and reading the resulting output for all of the delay trim settings.

6. The method of claim 1, the method is performed by a state machine.

7. The method of claim 6, further comprising the state machine determining when the data latches are programmed to a predetermined state.

8. The method of claim 1, wherein each data latch comprises zero setup/hold time.

9. A system comprising:
    a system controller; and
    a memory device coupled to the system controller, the memory device comprising:
        a plurality of data paths, each data path having a delay circuit coupled to a data latch;
        a clock path comprising a delay circuit coupled to each data latch, the clock path configured to generate a clock to clock data into the data latches;
        an inverse clock path comprising a delay circuit coupled to each data latch, the inverse clock path configured to provide an inverse clock to clock data into the data latches; and
        a controller coupled to outputs of the data latches and the delay circuits, the controller configured to program a delay trim setting in the data path delay circuits based on characteristics associated with each respective data path.

10. The system of claim 9, wherein the delay circuit for each of the clock path and inverse clock path comprises a delay trim setting that provides substantial alignment of transitions of the clock and inverse clock with transitions of the data.

11. The system of claim 9, wherein the controller is further configured to program the delay trim in response to user initiation of memory input alignment self-calibration.

12. The system of claim 11, wherein the controller is further configured to program the delay trim to compensate for timing shifts caused by memory usage over time and/or user conditions.

13. The system of claim 12, wherein the user conditions include voltage differences over time and/or temperature differences over time.

14. The system of claim 9, wherein the characteristics comprise doping levels and/or material differences.

15. A memory device comprising:
a plurality of data paths, each data path having a delay circuit coupled to a data latch;
a clock path comprising a delay circuit coupled to each data latch, the clock path configured to generate a clock to clock data into the data latches;
an inverse clock path comprising a delay circuit coupled to each data latch, the inverse clock path configured to provide an inverse clock to clock data into the data latches; and
a controller coupled to outputs of the data latches and the delay circuits, the controller configured to program a delay trim setting in the data path delay circuits based on characteristics associated with each respective data path.

16. The memory device of claim 15, the controller further configured to determine a state of each data latch.

17. The memory device of claim 16, wherein the controller is further configured to determine a boundary between a logical 1 and a logical 0 being programmed into each data latch in response to the respective delay trim setting for that particular data latch.

18. The memory device of claim 17, wherein the controller is configured to adjust the clock path delay circuit to align the clock path delay to a predetermined data path delay circuit when the boundary of the predetermined data path delay circuit cannot be determined.

19. The memory device of claim 15, further comprising a plurality of "DQ" pads, each "DQ" pad coupled to a respective data path.

20. The memory device of claim 15, wherein the controller is configured to update the delay trim setting in response to voltage differences over time or temperature differences over time.

* * * * *